United States Patent
Verhaverbeke (10) Patent No.: US 7,402,213 B2
(45) Date of Patent: Jul. 22, 2008

(54) STRIPPING AND REMOVAL OF ORGANIC-CONTAINING MATERIALS FROM ELECTRONIC DEVICE SUBSTRATE SURFACES

(75) Inventor: Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 140 days.

(21) Appl. No.: 11/347,516

(22) Filed: Feb. 3, 2006

(65) Prior Publication Data

US 2007/0181165 A1    Aug. 9, 2007

(51) Int. Cl.
    *B08B 7/04* (2006.01)
(52) U.S. Cl. ............ 134/40; 134/2; 134/3; 134/26; 134/30; 134/36; 134/42; 134/902
(58) Field of Classification Search ............ 134/2, 134/26, 30, 36, 40, 42, 902, 3
    See application file for complete search history.

(56) References Cited

U.S. PATENT DOCUMENTS

| | | | | |
|---|---|---|---|---|
| 5,464,480 A | 11/1995 | Matthews | ............ | 134/1.3 |
| 5,632,847 A | 5/1997 | Ohno et al. | ............ | 156/344 |
| 5,690,747 A | 11/1997 | Doscher | ............ | 134/1 |
| 6,080,531 A | 6/2000 | Carter et al. | ............ | 430/329 |
| 6,283,060 B1* | 9/2001 | Yamazaki et al. | ............ | 118/723 E |
| 6,284,654 B1* | 9/2001 | Roeder et al. | ............ | 438/681 |
| 6,551,409 B1 | 4/2003 | Degendt et al. | ............ | 134/2 |
| 6,663,722 B1* | 12/2003 | Higashino et al. | ............ | 134/26 |
| 6,674,054 B2 | 1/2004 | Boyers | ............ | 219/628 |
| 6,696,228 B2 | 2/2004 | Muraoka et al. | ............ | 430/329 |
| 6,699,330 B1 | 3/2004 | Muraoka | ............ | 134/3 |
| 2002/0066717 A1 | 6/2002 | Verhaverbeke et al. | ............ | 216/13 |
| 2002/0173156 A1 | 11/2002 | Yates et al. | ............ | 438/745 |
| 2004/0149317 A1* | 8/2004 | Jur et al. | ............ | 134/19 |
| 2005/0147749 A1* | 7/2005 | Liu et al. | ............ | 427/248.1 |
| 2006/0196525 A1* | 9/2006 | Vrtis et al. | ............ | 134/1 |

FOREIGN PATENT DOCUMENTS

| | | |
|---|---|---|
| EP | 0867924 | 9/1998 |
| JP | 59125760 | 1/1986 |
| JP | 2002/025971 | 1/2002 |

OTHER PUBLICATIONS

T. Ohmi, et al., "Native Oxide Growth and Organic Impurity Removal on Si Surface with Ozone-Injected Ultrapure Water", *J. Electrochem. Soc.*, vol. 140, No. 3, Mar. 1993.

* cited by examiner

*Primary Examiner*—Sharidan Carrillo
(74) *Attorney, Agent, or Firm*—Shirley L. Church; Moser IP Law Group (57) ABSTRACT

Described herein is a method of removing an organic-containing material from an exposed surface of a large substrate (at least 0.25 $m^2$). The substrate may comprise an electronic device. The exposed surface is treated with a stripping solution comprising ozone ($O_3$) in a solvent, where the solvent comprises acetic anhydride. The stripping solvent used to form the stripping solution may comprise a mixture of acetic anhydride with a co-solvent selected from the group consisting of a carbonate containing 2-4 carbon atoms, ethylene glycol diacetate, and combinations thereof. In some instances, the stripping solution may contain only acetic anhydride and ozone, where the ozone concentration is typically about 300 ppm or greater.

28 Claims, 6 Drawing Sheets

STRIPPING AND REMOVAL OF ORGANIC-CONTAINING MATERIALS FROM ELECTRONIC DEVICE SUBSTRATE SURFACES

BACKGROUND OF THE INVENTION

1. Field of the Invention

The invention relates to a method of removing organic-containing materials such as photoresists, high temperature organic layers, and organic dielectric materials from a substrate surface of a flat panel display or solar cell array or other large scale substrate (a substrate which is typically larger than about 0.5 meter by 0.5 meter).

2. Brief Description of the Background Art

The information in this Background Art portion of the application is provided so that the reader of the application can better understand the invention which is described subsequently. The presence of information in this Background Art portion of the application is not an admission that the information presented or a that a combination of the information presented is prior art to the invention.

The fabrication of electronic device structures is complicated by the number of different materials which are used, both to provide the elements of the functional device, and as temporary process structures during fabrication of the device. Since most of the devices involve the formation of layers of inter-related, intricate, patterned structures, photoresists and high temperature organic masking materials are commonly used during patterning of underlying layers of material which are present over large area (typically about 0.25 m$^2$ or greater) surfaces. A patterned photoresist is one of the temporary processing structures and must be removed once work on the underlying structure through openings in the photoresist is completed. Therefore, there is a need for an efficient and inexpensive method of removing, stripping, or cleaning of organic photoresists, as well as other organic layer residues, from large substrate surfaces. Due to the varying composition of a substrate underlying a photoresist, for example, it is important that a method used to remove the photoresist not be reactive with (corrosive to) surfaces underlying the photoresist. One problem has been the presence of metallic materials and the tendency of these materials to oxidize and dissolve the oxidized layer.

To be useful in processing of large surface areas, it is helpful to have the stripping and cleaning material be a non-corrosive fluid. The fluid should be minimally affected by the presence of an ambient atmospheric condition. It is also helpful when the removal process can be carried out at room temperature, or at least below about 80° C. Finally, it is always desirable that the fluid used for removal of the organic material be environmentally friendly.

In order to remove an organic material such as a photoresist for example, and specifically to strip photoresist from large substrate surfaces, a number of techniques have been used. Representative techniques for removing photoresists, as well as their advantages and disadvantages, are described below.

A Piranha solution, which consists of sulfuric acid ($H_2SO_4$) and hydrogen peroxide ($H_2O_2$), typically in a volumetric ratio of 4:1, works well for photoresist removal, but cannot be used on substrate surfaces which include exposed metal, because it will etch the metal. Also, because it is very viscous, the Piranha solution is difficult to rinse off a substrate surface after a photoresist removal process. Further, the $H_2SO_4/H_2O_2$ solution cannot be recovered or re-used many times, as it decomposes rapidly. Finally, the solution needs to be applied at relatively high temperatures of at least 70° C., and typically about 120° C.

Several other techniques for removal of organic photoresists are based on the use of organic solvent-based strippers, such as monoethanolamine (MEA), dimethylsulfoxide (DMSO), n-methylpyrrolidone (NMP), propylene glycol monomethyl ether acetate (PGMEA), ethyl lactate, and methylethylketone (MEK). Unlike the Piranha solution, these organic solvent strippers can be used when metals are present. However, these organic solvent strippers cannot be easily recovered after saturation with dissolved photoresist, because the photoresist is difficult to separate from the organic solvent. Therefore, the saturated organic solvent strippers must be disposed of, creating an environmental problem, or recovered for recycling using a distillation technique which is cumbersome and expensive. Like the Piranha solution, these solvents are typically heated prior to use, but to somewhat lower temperatures than the Piranha solution, typically around 50-65° C.

Japanese Patent Publication No. 59125760, of Tanno et al., published Jan. 10, 1986, describes dissolving ozone in an organic acid (such as formic acid or acetic acid) and using the ozonated organic acid to remove contamination from semiconductor substrates. Any heavy metal on the wafer is said to form a formate or an acetate, and any organic contaminant is decomposed by ozone, so that stains on the surface of the substrate can be removed.

T. Ohmi et al., in an article entitled "Native Oxide Growth and Organic Impurity Removal on Si Surface with Ozone-Injected Ultrapure Water" (*J. Electrochem. Soc.*, Vol. 140, No. 3, March 1993), describe the use of ozone-injected ultrapure water to remove adsorbed organic impurities from a wafer surface prior to other wafer cleaning procedures. Ozone concentration in the water was 1-2 ppm. The process described by Ohmi et al. was said to be capable of effectively removing organic contaminants from the wafer surface in a short time at room temperature. Processing waste from the process was said to be simple, and the chemical composition of the ozone-injected ultrapure water was said to be easily controllable.

U.S. Pat. No. 5,464,480, issued Nov. 7, 1995, to Matthews et al., and entitled "Process and Apparatus for the Treatment of Semiconductor Wafers in a Fluid", describes a process for removing organic materials from semiconductor wafers using chilled deionized water (1° C. -15° C.). The amount of ozone dissolved in the water is temperature-dependent. Lowering the temperature of the water is said to have increased the concentration of ozone in the water and to have increased the photoresist strip rate using the ozone/chilled water solution.

U.S. Pat. No. 5,632,847, issued May 27, 1997, to Ohno et al., and entitled "Film Removing Method and Film Removing Agent", describes a method of removing a film (e.g., an organic or metal-contaminated film) from a substrate surface by injecting ozone into an inorganic acid aqueous solution (e.g., a mixed solution of dilute HF and dilute HCl) and bringing bubbles formed by the ozone injection into direct contact with the film. Each bubble is said to be composed of an inside ozone bubble and an outside acid aqueous solution bubble. The Ohno et al. reference recommends an acid aqueous solution of 5 weight % or less, kept at room temperature, where the ozone concentration is within a range from 40,000 ppm to 90,000 ppm. Ozone has also been dissolved in sulfuric acid for use in cleaning semiconductor surfaces, as described, for example, in U.S. Pat. Nos. 4,917,123 and 5,082,518.

U.S. Pat. No. 5,690,747, issued Nov. 25, 1997, to Doscher, and entitled "Method for Removing Photoresist with Solvent and Ultrasonic Agitation", describes a method for removing photoresist using liquid organic solvents which include at least one polar compound having at least one strongly electronegative oxygen (such as ethylene diacetate) and at least one alicyclic carbonate (such as ethylene carbonate).

European Patent Publication No. 0867924, of Stefan DeGendt et al., published Sep. 30, 1998, and entitled "Method for Removing Organic Contaminants from a Substrate", describes the use of an agent to remove the organic contaminants, where the agent comprises water vapor, ozone, and an additive acting as a scavenger. Use of a liquid agent comprising water, ozone, and an additive acting as a scavenger is also discussed. The additive is recommended to be an OH radical scavenger, such as a carboxylic or phosphoric acid or a salt thereof. Preferred examples are acetic acid and acetate, as well as carbonate and phosphate. Although carboxylic acids as a whole are mentioned, there is no data for any carboxylic acid other than acetic acid. The authors describe how the ozone level of an aqueous ozone solution increases upon the addition of acetic acid to the water-based solution. They also disclose that photoresist strip rate increases upon the addition of acetic acid to an aqueous ozone solution. This publication is incorporated by reference in its entirety.

U.S. Pat. No. 6,080,531, issued Jun. 27, 2000, to Carter et al., and entitled "Organic Removal Process" describes a method of photoresist removal in which a treating solution of ozone and bicarbonate (or other suitable radical scavenger) is used to treat a substrate for use in an electronic device. The concentration of bicarbonate ion or carbonate ion in the treating solution is said to be approximately equal to or greater than the ozone concentration. The method is said to be suited to removal of photoresist (as well as other organic materials) where metals such as aluminum, copper, and their oxides are present on the substrate surface.

Japanese Patent Publication No. 2002/025971, published Jan. 25, 2002, and assigned to Seiko Epson Corp. and Sumitomo Precision Prod. Co., teaches the use of ozonated water with acetic acid and ultraviolet radiation to remove photoresist. Ozonated water containing acetic acid is continuously supplied to the center portion of a rotating substrate. The ultraviolet rays from a UV lamp are irradiated onto the substrate to remove resist adhering to the surface of the substrate. The process is said to remove organic substances such as resist adhering onto the substrate without need for high temperature heat treatment.

U.S. Patent Application Publication No. 2002/0066717 A1, of Verhaverbeke et al., published Jun. 6, 2002, and entitled "Apparatus for Providing Ozonated Process Fluid and Methods for Using Same", describes apparatus and methods for wet processing of electronic components using ozonated process fluids. Verhaverbeke et al. teach that it is desirable to have as high an ozone concentration as possible to achieve rapid cleaning of electronic components. Verhaverbeke et al. achieved ozone concentrations in water up to 300 g/m$^3$ by using a closed vessel with recirculated ozonated liquid, which is supplied under pressure. Verhaverbeke et al. describe the use of various chemically reactive process fluids which may be used in combination with ozone, including inorganic acids, inorganic bases, fluorinated compounds, and acetic acid. The Verhaverbeke et al. reference also provides an overview of the literature on the use of ozonated deionized water for photoresist removal from electronic component surfaces. This published patent application is incorporated by reference in its entirety.

U.S. Patent Publication No. 2002/0173156 A1, of Yates et al., published Nov. 21, 2002, and entitled "Removal of Organic Material in Integrated Circuit Fabrication Using Ozonated Organic Acid Solutions", describes the use of organic acid components to increase the solubility of ozone in aqueous solutions which are used for removing organic materials, such as polymeric resist or post-etch residues, from the surface of an integrated circuit device during fabrication. Each organic acid component is preferably said to be chosen for its metal-passivating effect. Such solutions are said to have significantly lower corrosion rates when compared to ozonated aqueous solutions using common inorganic acids for ozone solubility enhancement, due to a surface passivating effect of the organic acid component.

U.S. Pat. No. 6,551,409, issued Apr. 22, 2003, to DeGendt et al., and entitled "Method of Removing Organic Contaminants from a Semiconductor Surface", describes a method for removing organic contaminants from a semiconductor surface, where the semiconductor is held in a tank which is filled with a gas mixture comprising water vapor and ozone. DeGendt et al. teach that the use of gas phase processing, where the substrate surface is contacted with an ozone/water vapor mixture, enables an increase in ozone concentration near the wafer surface.

U.S. Pat. No. 6,674,054, issued Jan. 6, 2004, to Boyers et al., and entitled "Method and Apparatus for Heating a Gas—Solvent Solution", describes a method of quickly heating a gas—solvent solution from a relatively low temperature $T_1$ to a relatively high temperature $T_2$, such that the dissolved gas concentration at $T_2$ is much higher than if the gas had originally been dissolved into the solvent at $T_2$. The example of gas—solvent solution is an ozone gas in water solution. The objective is to heat a cold ozone—water solution using an in-line heater just prior to application of the solution to a substrate surface, to increase the reaction rate at the substrate surface. Table A in Col. 33 shows the solubility of ozone gas in water as a function of temperature and pressure. This '054 patent is incorporated by reference in its entirety.

U.S. Pat. No. 6,696,228, issued Feb. 4, 2004, to Muraoka et al., and entitled "Method and Apparatus for Removing Organic Films", describes a method and apparatus for removing an organic film such as a resist film from a substrate surface using a treatment liquid which can be recycled and re-used. The treatment liquid is typically formed from liquid ethylene carbonate, liquid propylene carbonate, or a mixture thereof, and typically contains dissolved ozone. Since ethylene carbonate is a solid at room temperature, this photoresist removal method requires the use of elevated temperatures, in the range of about 50-120° C.

U.S. Pat. No. 6,699,330, issued Mar. 2, 2004, to Muraoka, and entitled "Method of Removing Contamination Adhered to Surfaces and Apparatus Used Therefor", describes a method of removing surface-deposited contaminants from substrates for electronic devices. The method includes bringing an ozone-containing treating solution into contact with the surface of a treating target (such as a semiconductor substrate) on which contaminants have deposited. The ozone-containing treating solution comprises an organic solvent having a partition coefficient to ozone of 0.6 or more, where the partition coefficient refers to a partition or division of gaseous ozone between an organic solvent that is in a liquid phase at standard temperature and pressure and an inert gas in a gaseous phase which comes in contact with the organic solvent. Any organic solvents are said to be useful in the invention, so long as they provide the desired partition coefficient. Preferably organic solvents are fatty acids, including acetic acid, propionic acid, and butyric acid. Enabling embodiments are provided for acetic acid. Ozonated acetic acid is used in a closed system with a constant ozone partial pressure above the system to keep a high concentration of ozone in the acetic acid and to minimize evaporation of the acetic acid.

Although high concentrations (≧200 ppm) of ozone can be obtained in acetic acid, and ozonated acetic acid may provide a rapid photoresist strip rate (≧1 μm/min), there are major drawbacks to the use of ozonated acetic acid for photoresist removal. One of the primary considerations is corrosivity. The presence of acetic acid has been observed to cause corrosion in metals, in particular, copper and molybdenum. These metals are commonly used in the flat panel display industry. Further, acetic acid is a solid at temperatures below about 16.7° C., which can cause problems under some desired processing conditions.

In view of the above, there is a need for an improved method of stripping and cleaning organic materials from electronic device surfaces, particularly when metals are present. In particular, there is a need for a stripping and cleaning method which has universal applicability with respect to the surface composition of the substrate. Due to the common presence of metals in semiconductor device substrates, flat panel display substrates, and solar cell arrays, methods of stripping and cleaning organic materials which are harmful when metals are present are not attractive.

Further, with respect to the manufacture of large flat panel substrates (such as those used for AMLCD or AMOLED panels, and in some instances solar panels), there is a need for a stripping and cleaning solution that can be applied over a stationary object or on an object that is moving on a conveyor belt in an atmospherically exhausted environment.

In addition, it would be highly desirable if the stripping and cleaning solution could be re-used over multiple processing cycles, without the need for frequent replenishment or filtering of the solution. It would also be advantageous if such an improved method for the removal of organic materials could be performed at room temperature.

SUMMARY OF THE INVENTION

Described herein is method of removing an organic-containing material from an exposed surface of a large substrate (at least 0.25 m$^2$). The exposed surface of the substrate may comprise an electronic device. The exposed surface is treated with a stripping solution comprising ozone ($O_3$) in a solvent, where the solvent comprises acetic anhydride. The method has a number of advantages, including but not limited to the following: A rapid organic material removal rate of at least 0.5 μm/min, and typically greater than about 2 μm/min is typically obtained. Low corrosivity with respect to metals such as copper, molybdenum, and tungsten is observed, where the corrosion rate has been observed at about 1 nm/min. for copper, to 0.6 nm/min. for molybdenum, to 0 nm/min. for tungsten. The reagent solution ("stripping solution') used to remove the organic-containing material is designed to avoid or minimize reactivity with metals to any extent which affects the overall electronic performance of the metal after the stripping process. The stripping process can be performed at room temperature (about 25° C.) if desired. Further, the stripping process may be performed in an atmospheric pressure exhausted system, if desired, in view of the volatility of the stripping solution. The stripping solution can be recycled over multiple processing cycles, so that it needs to be refreshed only about every 24 hours, or longer. In addition, the stripping solution is easily cleaned off the substrate surface using a water rinse.

The stripping solution comprises ozone ($O_3$) in a solvent, where the solvent comprises acetic anhydride. The stripping solvent used to form the stripping solution may comprise a mixture of acetic anhydride with a co-solvent selected from the group consisting of a carbonate containing 2-4 carbon atoms, ethylene glycol diacetate, and combinations thereof. In some instances, the stripping solution may contain only acetic anhydride and ozone, where the ozone concentration is typically about 300 ppm or greater. When a co-solvent is used, the stripping solution comprises acetic anhydride, ozone, and a co-solvent which may be present at a concentration ranging from about 20% by volume to about 80% by by volume of the stripping solution. When the co-solvent is a mixture of a carbonate with ethylene glycol diacetate, the ratio of carbonate to ethylene glycol diacetate may range from about 1:1 up to about 3:1.

The method of the invention may be used to strip organic materials from the surface of a substrate without concern that an exposed metal will be harmed in a manner which substantially affects the performance of a device which relies on performance of the metal.

The concentration of ozone in the stripping solution typically ranges from about 50 ppm to about 600 ppm; more typically from about 100 ppm to about 500 ppm; and often from about 300 ppm to about 500 ppm. If the stripping solution contains too little ozone, the organic material removal rate will be unacceptably slow. With minimal experimentation, one skilled in the art will be able to determine an appropriate ozone concentration, based on the composition of the substrate surface. Because the solubility of ozone in an acetic anhydride-containing stripping solution increases as the concentration of acetic anhydride increases, the concentration of acetic anhydride in the stripping solution is often the maximum possible, depending on the composition of the substrate beneath the organic material which is being removed. When the stripping solution includes a co-solvent with the acetic anhydride, the co-solvent must not react with the acetic anhydride or the substrate beneath the organic material. Co-solvents which work particularly well include ethylene carbonate and ethylene glycol diacetate.

When the stripping solution comprises acetic anhydride with at least one co-solvent of the kind described above, the concentration of ozone in the stripping solution typically ranges from about 50 ppm to about 300 ppm.

Pure acetic anhydride exhibits a vapor pressure of about 500 Pa at 20° C. An acetic anhydride-comprising stripping solvent typically exhibits a vapor pressure within the range of about 100 Pa to about 600 Pa; more typically, from about 100 Pa to about 500 Pa.

Acetic anhydride exhibits a vapor pressure which is about one third that of acetic acid at 20° C. As a result, there is a much more mild odor when acetic anhydride is used as a stripping solvent than when acetic acid is used as a stripping solvent. An anhydride-comprising stripping solvent can be used in an atmospheric pressure exhausted environment.

Acetic anhydride is a liquid at standard temperature (25° C.) and pressure, since the melting point of acetic anhydride is approximately −73° C. As a result, the problems which may occur when acetic acid is used as a stripping solvent (acetic acid has a melting point of about 16.7° C. at standard pressure) do not occur when acetic anhydride is used as a stripping solvent. Since the solubility of ozone in acetic anhydride is essentially the same as the solubility in acetic acid, there are definite advantages to using acetic anhydride as the principal ingredient in a stripping solvent. Use of an acetic anhydride-comprising stripping solvent at room temperature is advantageous. When pure acetic anhydride is used as the solvent portion of the stripping solvent, the recommended temperature range for removing organic materials from the substrate ranges from about 15° C. to about 80° C. More typically, the stripping temperature will be the range of about 20° C. to about 40° C.

The recommended temperature ranges are based on a combination of factors, including the time required for stripping and cleaning (removal) of the organic material and the decomposition rate of the organic material which is being stripped in the stripping solution, the volatility of the stripping solution, and the melting points of the ingredients of the stripping solution. When the stripping solvent comprises acetic anhydride in combination with about 20% by volume to about 80% by volume of one of a carbonate containing from 2 to 4 carbons (such as ethylene carbonate), ethylene glycol diacetate, or a combination thereof, a typical temperature range for removal of the organic material from the substrate is about 15° C. to about 80° C. In one typical embodiment, the stripping solvent comprises about 20% by volume acetic anhydride, about 40% by volume ethylene carbonate, and about 40% by volume ethylene glycol diacetate. One skilled in the art will be able to optimize the stripping temperature range for a specific application after minimal experimentation based on the present disclosure.

Since organic compounds actually decompose (rather than just dissolve) in ozonated anhydride stripping solutions, the stripping solution can be re-used over multiple processing cycles. The number of cycles for which the stripping solution can be re-used will depend on the maximum concentration of organic material residue which is tolerable in the stripping and cleaning solution. Typically a production line for stripping organic materials from a substrate can be operated for at least one day without the need to refresh the stripping solution.

The addition of a carbonate, or ethylene glycol diacetate, or a combination of these co-solvents to an acetic anhydride/ozone stripping solution both reduces the odor of the stripping solution and the minor corrosivity exhibited by the anhydride-comprising stripping solution. However, the solubility of ozone in the stripping solution is reduced by the co-solvent.

BRIEF DESCRIPTION OF THE DRAWINGS

The drawings which follow may be used in combination with the detailed description to aid in understanding of the invention. Identical reference numerals have been used, where possible, to designate identical elements that are common to the figures.

DETAILED DESCRIPTION OF EXEMPLARY EMBODIMENTS

As a preface to the detailed description presented below, it should be noted that, as used in this specification and the appended claims, the singular forms "a", "an", and "the" include plural referents, unless the context clearly dictates otherwise. The term "about", as used herein, refers to a value or range which may encompass plus or minus 10% of a particular cited value or range.

Figure 1:
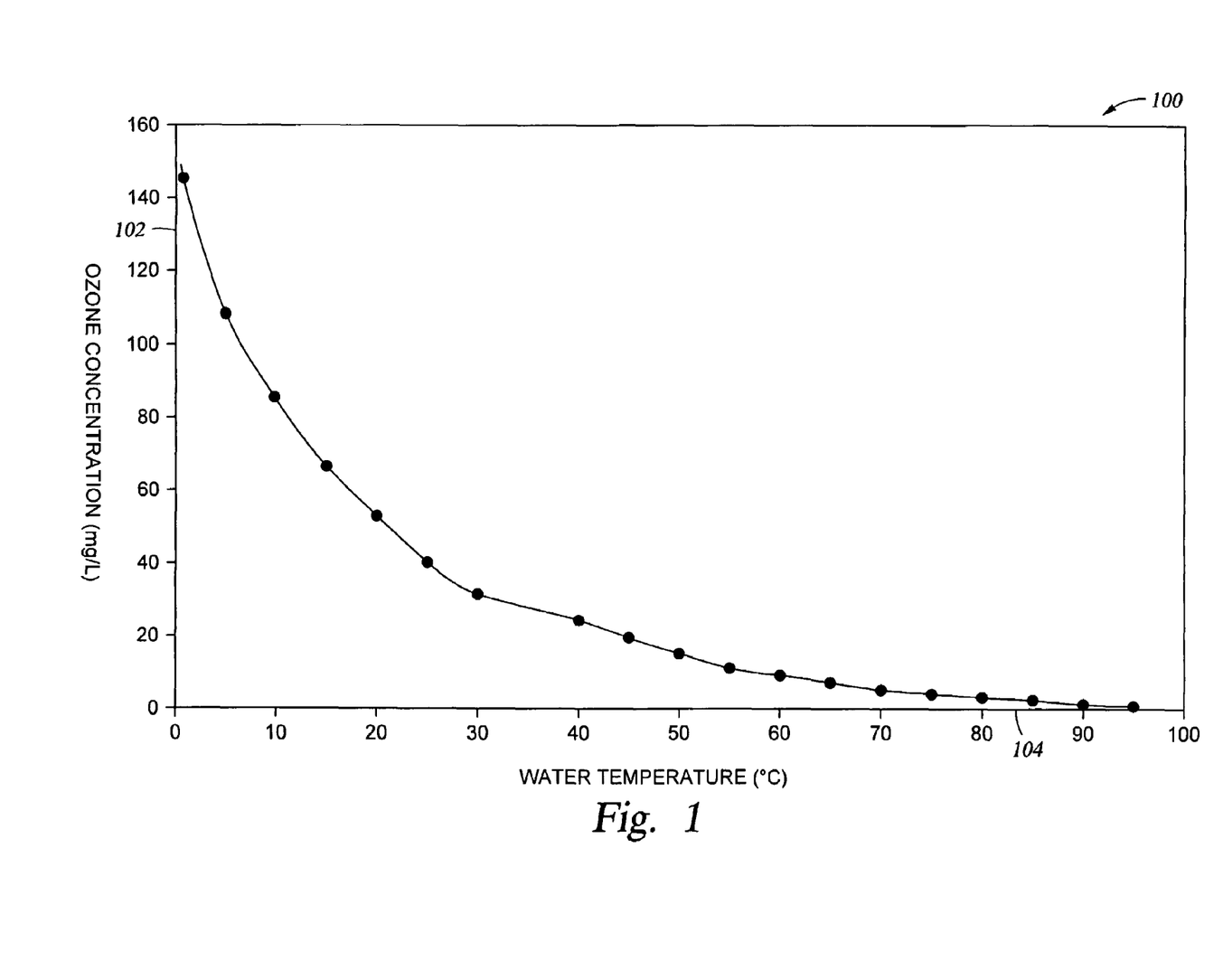
FIG. 1 is a graph showing the concentration of dissolved ozone (in mg/L i.e. ppm) as a function of deionized water temperature (in ° C.), when the water surface is in contact with ozone gas in oxygen at a concentration of 240 mg/L.

FIG. 1 is a graph 100 showing the concentration on axis 102 of dissolved ozone in deionized (DI) water (in mg/L, i.e. in ppm) a function of the (DI) water temperature shown on axis 104, when the DI water surface is in contact with ozone gas at a concentration of 240 mg/L in oxygen. It is readily apparent that the solubility of ozone in deionized water at room temperature (approximately 25° C.) is only about 40 mg/L. This requires the use of chilled (below room temperature) temperatures when a stripping solution of dissolved ozone in DI water is used, just to obtain a more helpful ozone concentration in the stripping solution.

Ozone concentration in deionized water, acetic acid, and acetic anhydride solvents, where the solvent temperature is 19° C., and the solvent surface is in contact with ozone in oxygen at a concentration of about 240 mg/L at 19° C. is presented in Table One, below.

TABLE ONE

Ozone Concentration in Various Solvents at 19° C.

| Solvent | Dissolved $O_3$ Concentration (mg/L) |
|---|---|
| DI Water | 55 |
| Acetic Acid | 503 |
| Acetic Anhydride | 503 |

As described in several of the publications referenced in the "Brief Description of the Background Art" section above, the concentration of ozone in an aqueous solution can be increased by adding acetic acid to the solution. Ozone can also be dissolved in pure acetic acid. Ozone dissolved in acetic acid or formic acid can be used to remove organic contamination and to strip photoresist from electronic device substrates. However, as previously discussed, acetic acid and formic acid are corrosive with respect to metals such as copper and molybdenum, which are used in flat panel display electronic elements. Copper and molybdenum are often present at the surface of a substrate at the time it is desired to remove an organic material from the surface of the substrate.

The use of an acetic anhydride solvent rather than an acetic acid solvent makes it possible to reduce the corrosion of copper and molybdenum by a surprising amount. Table Two below shows a comparison of metal corrosion rates for copper, molybdenum and tungsten when exposed to a stripping solution of ozone in acetic acid, compared with a stripping solution of ozone in acetic anhydride. The concentration of ozone present in each solution was 300 mg/L and the exposure temperature was 20° C., with an exposure time period of one minute.

TABLE TWO

Metal Corrosion Rates in Ozone Solutions, in nm/min

| Stripping Solvent | Copper Corrosion Rate (nm/min.) | Molybdenum Corrosion Rate (nm/min.) | Tungsten Corrosion Rate (nm/min.) |
| --- | --- | --- | --- |
| Acetic Acid/Ozone | 20 | 4 | 0 |
| Acetic Anhydride/Ozone | 1 | 0.6 | 0 |

Clearly, there is a surprising reduction in the corrosion rate when the ozonated acetic acid stripping solvent is replaced by an ozonated acetic anhydride stripping solvent. This difference in corrosion rate enables a more complete removal of an overlying organic material while maintaining the performance capability of a metal-comprising device structure which is exposed on the surface of a substrate from which the overlying organic material is being removed.

Table Three below illustrates other important physical property differences between acetic acid and acetic anhydride which show that acetic anhydride is a preferred stripping solvent when compared with acetic acid.

TABLE THREE

Physical Property Comparison, Acetic Acid and Acetic Anhydride

| Physical Property | Acetic Acid | Acetic Anhydride |
| --- | --- | --- |
| Vapor Pressure (mm Hg at 20° C.) | 11 | 3.75 |
| Flash Point (° C.) | 40 | 54 |
| Melting Point (° C.) | 16.7 | −73 |
| Boiling Point (° C.) | 118 | 139 |

Table Three shows a lower vapor pressure for acetic anhydride. This helps to reduce odor in the workplace attributable to presence of the stripping solvent. The higher flash point of acetic anhydride reduces the fire danger when acetic anhydride/ozone is used as the stripping solvent. The lower melting point of acetic anhydride ensures that the stripping solvent will remain a liquid under the conditions at which it is used.

Ozonated acetic anhydride, at an ozone concentration of about 300 mg/L, when used as a liquid stripping agent at about 20° C., can remove 1 μm of photoresist from the surface of a semiconductor substrate (of the kind used to produce flat panel displays) in a time period of 60 seconds. Since organic compounds, including photoresists, typically decompose (rather than just dissolve) in ozonated solutions comprising acetic anhydride, a considerable amount of the decomposition products are volatilized and easily removed. As a result, the stripping solution can be recycled for re-use over multiple processing cycles. The number of cycles for which the stripping solution can be re-used will depend on the maximum concentration of organic material residue which is tolerable in the stripping and cleaning solution. Distilled water or deionized water is frequently used to wash off residual stripping solution from a substrate surface. Other solvents may be used to wash off residual stripping solution, depending on ease of handling in a particular application, and it is not intended that deionized water be the only rinse solution which may be used.

However, since acetic anhydride is converted to acetic acid when exposed to water, use of a water rinse to remove residual ozonated anhydride-comprising stripping solution from the semiconductor substrate is easy. The required rinse time, using a sprayed-on rinse solution, is in the range of about 30 seconds; and, the rinse can be easily processed to remove dissolved organic materials, with the acetic acid being recovered from the rinse if desired.

The corrosiveness and volatility of acetic anhydride, can be further reduced by mixing the anhydride with another organic solvent which is even less corrosive. The other non-corrosive organic solvent should be non-reactive with ozone and should exhibit a volatility which is typically less than about 30% higher than the volatility of acetic anhydride. Solvents which are non-corrosive to metals, which have little or no reactivity with ozone, which exhibit very limited reactivity with anhydrides, which are soluble in acetic anhydride, and which are liquid at room temperature when mixed with the anhydride are most desirable. Solvents which meet these criteria include (for example and not by way of limitation) ethylene carbonate, propylene carbonate, and ethylene glycol diacetate.

Ethylene carbonate is a colorless, odorless solid with a flashpoint of 143.7° C. and a freezing point of 36.4° C. In its pure state, ethylene carbonate is a solid at room temperature. Ethylene carbonate is non-reactive to ozone, non-corrosive to metals, and is miscible in acetic anhydride.

Like ethylene carbonate, propylene carbonate is odorless and colorless. Propylene carbonate is a liquid at room temperature. The disadvantage of propylene carbonate is that it is less soluble in water than ethylene carbonate, and thus it is more difficult to rinse residual propylene carbonate off a stripped substrate surface.

Like ethylene carbonate and propylene carbonate, ethylene glycol diacetate is colorless and low in odor. Ethylene glycol diacetate is a liquid at room temperature.

The solubility of ozone in ethylene carbonate or propylene carbonate is considerably less than the solubility of ozone in acetic anhydride (about 40 ppm ozone in ethylene carbonate, as opposed to roughly 500 ppm ozone in acetic anhydride, at 20° C.). Because of this decrease in ozone solubility, addition of a carbonate to the stripping solution would be used only when the substrate from which the organic material is being stripped is particularly sensitive to corrosion by the stripping solution.

To provide an acceptable organic material removal rate and to maximize corrosion protection, a balance must be achieved between the concentration of the acetic anhydride and the concentration of a co-solvent used in the stripping solution. Typically, the carbonate co-solvent containing from 2 to 4 carbons is added in an amount so that the stripping solvent comprises between about 10 and about 90 volume % of this co-solvent; more typically, the carbonate comprises between about 20 and about 70 volume % of the stripping solvent; and often the carbonate comprises between about 30 and about 40 volume %, of the solvent.

The present method of removing organic-containing material can be performed in a simple atmospheric pressure exhausted environment, since a solvent comprising anhydride, alone or in combination with a co-solvent of the kind described above is not particularly volatile or offensive in odor at temperatures of about 40° C. or lower. Due to their relatively low volatility of acetic anhydride and the co-solvents mentioned herein, the ozonated stripping solution can be sprayed without excessive evaporation, and in most instances can be applied at room temperature, which is typically far below the flammability point of acetic anhydride, as previously mentioned.

Ideally, the ozone will decompose or oxidize the organic material completely to $CO_2$ or a carboxylic acid, which then is either vented through an exhaust system or is retained within the solvent. However, minimal quantities of non-oxidizable organic material components may remain after an organic material removal process. These non-oxidizable components will eventually begin to build up in the stripping solution comprising acetic anhydride and ozone. Solid contaminants which remain in the stripping solution upon recycling can be filtered out of the solution. From time to time (possibly only once a day, or even longer in most instances, depending on the solvent system), the stripping solution may need to be refreshed to flush out any residues which are accumulating. Organic residues may be removed using a "bleed-and-feed" process of the kind known in the art.

Ozonated acetic anhydride-comprising stripping solution is very easily removed from the substrate by rinsing with deionized water, as previously described, because the acetic anhydride is converted to acetic acid, which is completely miscible with water. Following an organic-containing material removal process, a final treatment with deionized water or ozonated deionized water can be used to rinse off the residual stripping solution. The ozonated deionized water is used only when there is no corrosion problem on the surface of the substrate. The ozonated deionized water is helpful in removing any residual organic materials on the substrate surface which contain single carbon-to-carbon bonds. In one embodiment of the method, a substrate surface is first sprayed with a liquid ozonated acetic anhydride-comprising stripping solution, to remove organic material from the substrate surface, followed by a second spraying with a liquid ozonated deionized water to remove any remaining organics, and to rinse off the ozonated stripping solution. Optionally, a final step may be used, in which deionized water is used to remove residue from the first rinse.

In another embodiment of the present method, the stripping solvent is applied to the substrate surface as a vapor (rather than as a liquid). In the case of vapor application, the use of pure acetic anhydride/ozone stripping solution (as opposed to use of a co-solvent ) simplifies recycling of the stripping solution. One skilled in the art will recognize that use of a combination of ingredients typically causes the vapor concentration to be different than the liquid concentration. Typically, the volatilizing temperature of the solvent is within a range of about 20° C. to about 150° C. The solvent vapor is brought into contact with the substrate to be stripped of organic-containing material. The solvent vapor may then be condensed on the substrate surface, leaving a layer of condensed stripping solvent on the substrate surface, followed by contacting the condensed layer with ozone gas. The ozone dissolves into the stripping solvent to form a condensed layer of ozonated acetic anhydride-comprising stripping solution that will remove the organic-containing material.

In another embodiment, ozone gas may be used as a carrier gas to bring vaporized acetic anhydride-comprising solvent to the workpiece surface. In this instance, the stripping solvent is more easily a combination of ingredients, as long as these ingredients can be entrained in the ozone carrier gas, to provide an ozonated stripping solution at the substrate surface.

I. APPARATUS FOR PRACTICING THE INVENTION

Figures 2A, 2B:
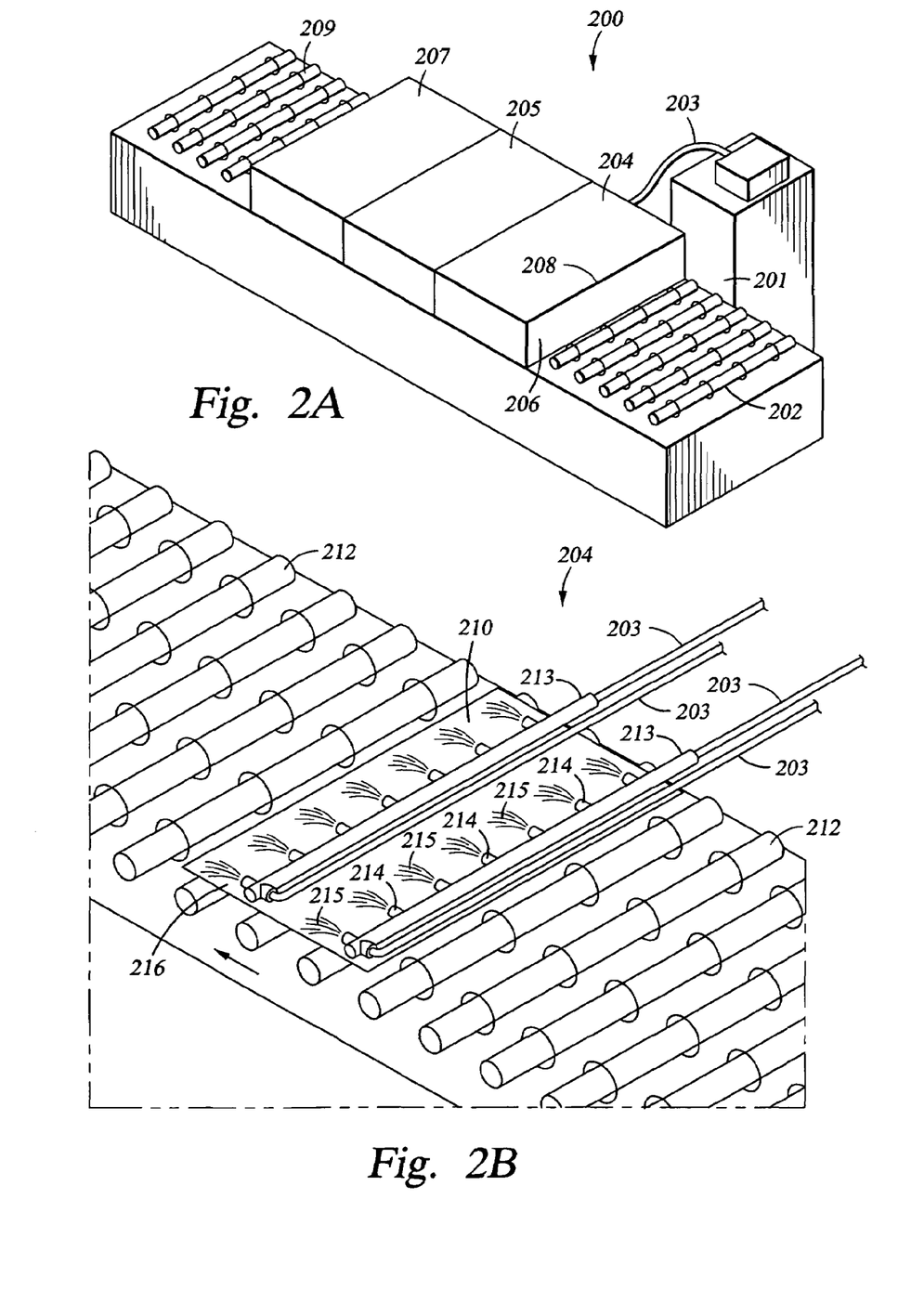
FIG. 2A shows a schematic of one embodiment of an organic material stripping system of the kind which can be used to process large substrate in a relatively open, vented system. The stripping solution is sprayed onto a substrate surface as the substrate moves along a conveyor.
FIG. 2B is a schematic showing an interior view of enclosed stripping area 204 of FIG. 2A, with a large flat panel display substrate, such as a glass-comprising substrate 210, passing under an overhead stripping solution supply conduit 213. The stripping solution is applied by spray 215 from spray nozzles 214.

FIG. 2A shows one apparatus embodiment which may be used for stripping of organic-comprising materials from the surface of large flat panels of the kind used for flat panel display products. The apparatus 200 makes use of a spray application of stripping solvent to the surface of the substrate from which the organic-comprising material is to be removed. The apparatus illustrated in FIG. 2A is useful for processing substrates which may be as large as several meters in width and length. The processing environment is open at the entry conveyor location 202 and is exhausted in areas where the stripping solvent is applied, such as in enclosed stripping area 204. FIG. 2A shows a stripping apparatus 200 where a substrate (not shown) is loaded onto an open entry conveyor 202, and enters into an enclosed stripping area 204 through an opening 206 at the leading end 208 of the enclosed stripping area. The substrate enters enclosed (and exhausted, not shown) stripping area 204, where stripping solvent (not shown) is applied from supply 201 through conduits 203. FIG. 2B shows a close-up schematic of the interior of enclosed stripping area 204, in which a flat panel substrate 210 is moving across conveying rollers 212, while stripping solution 215 is sprayed onto the surface 216 of substrate 210 through spray nozzles 214. The spray nozzles 214 are arranged so that the entire surface 216 of the substrate 210 will be uniformly coated with the stripping solution.

After application of the stripping solution 215, the substrate passes into enclosed area 205 where a rinse (not shown) is used to wash off residual stripping solvent from the substrate. The rinse may be applied in a manner similar to that shown for the stripping solvent in FIG. 2B. After application of the rinse to the substrate surface, the substrate is passed into a drying area 207, where the substrate is dried in a manner known in the art, such as by the application of gas flow across the substrate surface, use of heating lamps, or other commonly known techniques. After drying of the substrate, the substrate passes onto exit conveyor 209 for further handling.

Figure 3:
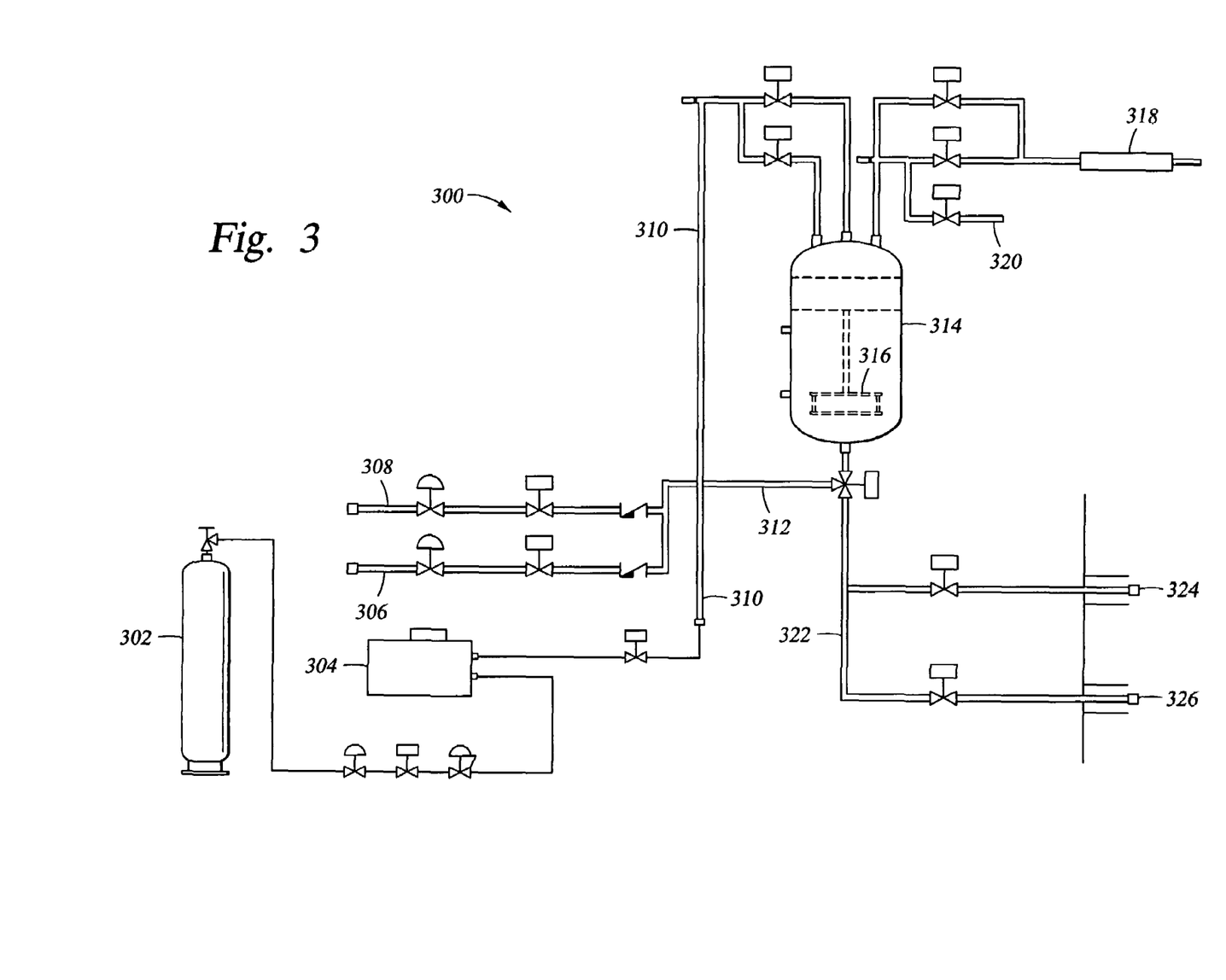
FIG. 3 is a schematic of an exemplary stripping solution preparation system 300, where an anhydride-comprising solvent is ozonated, to provide an ozonated anhydride-comprising stripping solution.

FIG. 3 is a schematic of an exemplary apparatus 300 for the preparation of an ozonated acetic anhydride-comprising stripping solution. The ozonated acetic anhydride-comprising stripping solution may be supplied to a spray dispenser (such as that shown in FIG. 2B), by way of example and not by way of limitation. The ozone used for ozonation of a stripping solution which comprises acetic anhydride is typically generated in an ozone generator 304 which is supplied by an oxygen source 302 (which may provide $O_2$ or air). The ozone is generated by applying a silent discharge (a discharge between 2 electrodes which is not self sustaining) to the oxygen or air, to produce an ozone containing gas . The ozone-containing gas is supplied to a solution preparation tank 314 through line 310, which feeds a sparger/mixer 316 which dispenses ozone into a liquid acetic acid-comprising solvent (not shown) which is present in solution preparation tank 314. Also included in the ozonated acetic anhydride-comprising stripping solution preparation apparatus 300 are (for example, and not by way of limitation) an acetic anhydride supply system, which may supply acetic anhydride and other co-solvents (not shown).

In one embodiment, by way of example and not by way of limitation, acetic anhydride in liquid form is fed, from line 306 and a co-solvent of the kind previously described is fed from line 308, respectively, into a common line 312 which feeds into stripping solution supply tank 314. When stripping solution supply tank 314 is not being filled, acetic anhydride from line 306 may be fed into common line 312, and from there to common line 322 and into line 324, which may be used to feed a stripping apparatus (not shown) in a process which makes use of acetic anhydride stripping solvent which is not ozonated. Common line 322 may also be used to drain residual ozonated acetic anhydride-comprising solution from solution preparation tank 314 through drain line 326. The system may optionally include additional solvent supply apparatus (not shown) for optional co-solvents to be used in combination with an anhydride stripping solvent (such optional solvents may be a carbonate containing from 2-4 carbons, or ethylene glycol diacetate, as previously discussed, by way of example and not by way of limitation).

Figure 4A:
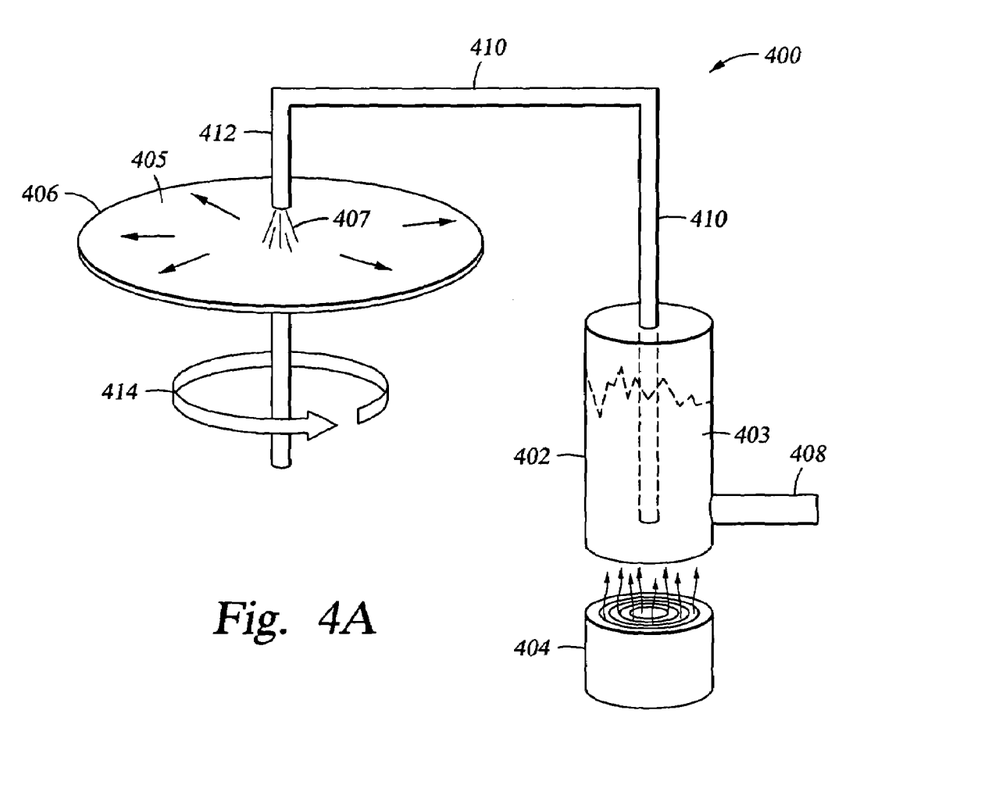
FIG. 4A is a simplified schematic of a bubbler apparatus which can be used to generate vaporous ozonated anhydride-comprising stripping solution from a liquid ozonated anhydride-comprising stripping solution of the kind produced by the preparation system 300 shown in FIG. 3.

As previously discussed, the acetic anhydride-comprising stripping solution may alternatively be applied to a substrate surface in the form of a vapor. FIG. 4A is a simplified schematic of a bubbler apparatus 400 which can be used to prepare and apply a vaporous acetic anhydride-comprising stripping solution to a substrate 406 surface 405. For example (and not by way of limitation), a solution 403 comprising acetic anhydride (and potentially other optional solvents in admixture with the acetic anhydride) in a tank 402 is heated using heater 404. Ozone gas is supplied to tank 402 through an ozone intake 408. Vaporous ozonated acetic anhydride-comprising stripping solution 407 is supplied through line 410 and nozzle 412 to the surface 405 of a substrate 406. The temperature of the vaporous ozone saturated acetic anhydride-comprising stripping solution 407 is kept higher than the temperature of the wafer 406 surface 405. Ozone-saturated acetic anhydride-comprising stripping solution vapor 407 condenses on the cooler surface 405 of substrate 406. To increase mass transfer of ozone at to the substrate surface 405, fresh ozone is continuously introduced into the acetic anhydride-comprising solution 403 in tank 402. The layer of stripping solution (not shown) on the substrate surface 405 is very thin, so that ozone diffuses through the layer rapidly.

Figure 4B:
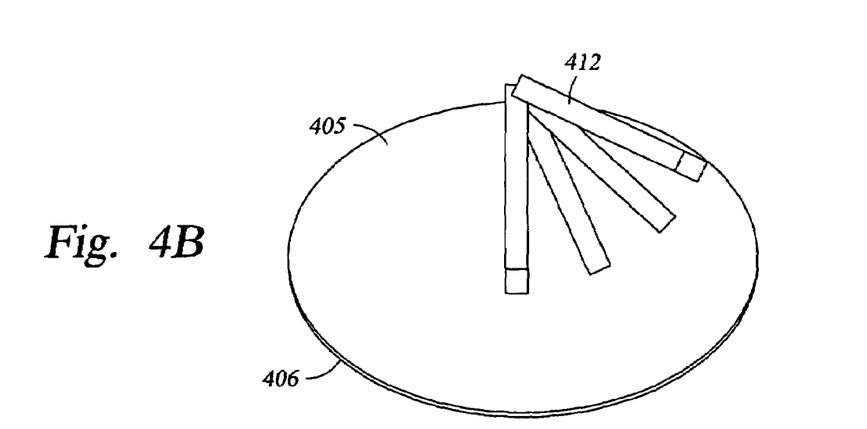
FIG. 4B is a schematic showing a nozzle 412 scanning over the surface 405 of a substrate 406 which is a rotating wafer. This is an embodiment method of applying a stripping solution over a substrate surface, where the anhydride-comprising stripping solution is in vapor form 407 as it exits nozzle 412.

FIG. 4B is an illustration of the application of the vaporous stripping solution 407, where an application nozzle 412 (for example and not by way of limitation, as several nozzles may be used) is scanned over the surface 405 of substrate 406. The substrate is typically rotated as shown by arrow 414 in FIG. 4A, to aid in distributing the constant feed of condensing ozonated anhydride-comprising stripping solvent (not shown) over substrate surface 405.

Figure 4C:
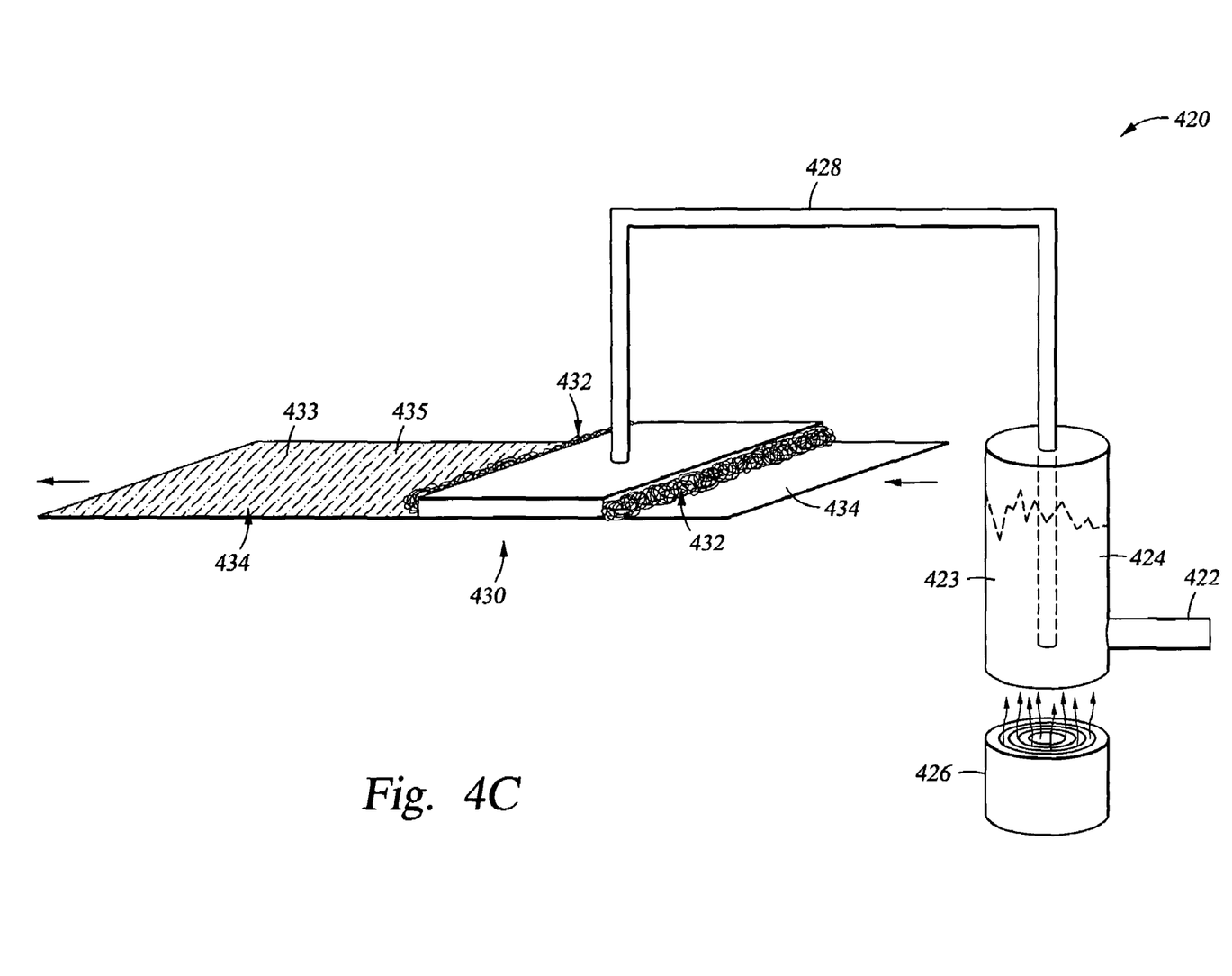
FIG. 4C is a schematic showing a vapor distribution plate 430 used in combination with a bubbler 424 which generates a vapor form of an anhydride-comprising stripping solution. The vapor distribution plate 430 distributes the stripping vapor 432 evenly over a substrate 434 surface 433.
Figure 5A:
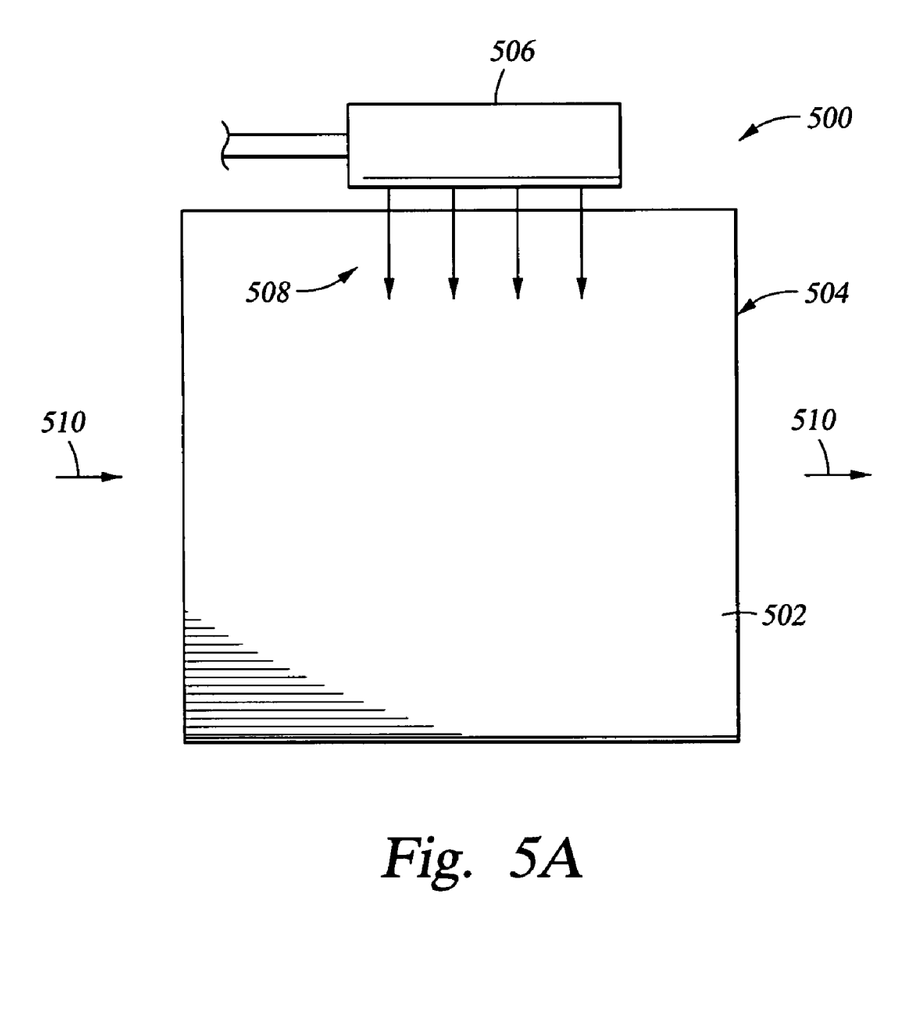
FIG. 5A is a schematic front-view of an alternative embodiment system 500 for applying either a liquid stripping solution or a liquid rinse for removing stripping solution residue to a substrate 504 surface 502. The liquid is sprayed 508 upon the surface 502 as the substrate 504 moves past a spray applicator 506.
Figure 5B:
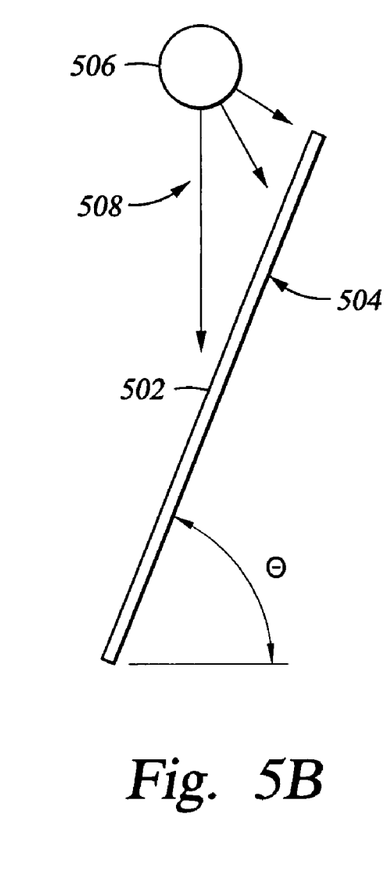
FIG. 5B is a schematic side view of the alternative embodiment system shown in FIG. 5A. The substrate 504 is positioned at an angle θ from horizontal, so that spray 508 from spray applicator 506 will be pulled toward the bottom of substrate 504, using gravity assist to remove the liquid stripping solution or liquid rinse.

FIG. 4C shows a simplified schematic of another vaporous stripping solvent application apparatus 420, where ozone is fed through ozone intake line 422 into a bubbler tank 424 containing at least one anhydride solvent (and potentially other co-solvents) 423. The ozonated solvent present in bubbler tank 424 is heated using heater 426 to produce a vapor which is fed through a line 428 into a distribution plate 430, from which stripping vapor 432 is dispensed onto a flat panel substrate 434 which is moving under distribution plate 430 in the manner shown, on a conveyor (not shown). The vapor condenses on substrate 434 surface 433 to produce a condensed stripping solvent 435 on the surface 433 of substrate 434. One skilled in the art will recognize that the substrate 430 could be stationary, with the distribution plate 430 moving past the substrate 430.

II. EXAMPLES

Example One

Removal of Photoresist from a Substrate Surface Using Ozonated Acetic Anhydride

A layer of a deep ultra-violet (DUV) photoresist which is sensitive to 248 nm radiation (UV 6, available from Shipley, Marlborough, Mass.) was applied to a thickness of approximately 10,000 Å (1,000 nm) onto the surface of a single-crystal silicon wafer. The photoresist was applied using a spin-on process, then baked for 30 minutes at 95° C. Ozonated acetic anhydride (100% acetic anhydride) stripping solution containing about 300 ppm (mg/L) of ozone was sprayed onto the surface of the photoresist-coated substrate at room temperature (25° C.) using a dispensing system such as that shown in FIG. 2B. The ozonated acetic anhydride was allowed to react with the photoresist for a period of 30, 60, or 120 seconds, then rinsed off the substrate surface by spraying with deionized water for a period of 10 to 20 seconds.

A series of six substrate samples were tested, where 1 µm of photoresist was present on each substrate, and the exposure time to stripping solution was varied from 30 seconds to about 120 seconds. Subsequent to the photoresist stripping procedure, each sample was examined and measured for residual photoresist. It was discovered that the 1 µm of photoresist was removed after 30 seconds (or less) from all of the substrates.

Example Two

Corrosivity of Ozonated Acetic Anhydride on Aluminum

A layer of aluminum was deposited to a thickness of about 10,000 Å onto the surface of a single-crystal silicon wafer using a physical vapor deposition (PVD) process of the kind known in the art. To test the corrosivity of ozonated acetic anhydride stripping solution on aluminum, ozonated acetic anhydride (100% acetic anhydride) stripping solution containing about 300 ppm (or mg/L) of ozone was sprayed onto the surface of the aluminum-coated substrate at room temperature (25° C.) using a dispensing system such as that shown in FIG. 2B. The ozonated acetic anhydride stripping solution was allowed to react with the aluminum for a period of 30, 60, or 120 seconds, then rinsed off the substrate surface by spraying with deionized water for a period of 10 to 20 seconds.

Within the accuracy of our ability to measure, aluminum was not removed by the ozonated acetic anhydride stripping solution. There appears to be a slight increase in the thickness of the aluminum layer, but the amount of increase in inconsistent with time. The increase in thickness of the aluminum layer may be due to the formation of $Al_2O_3$ on the surface of the aluminum layer due to exposure to $O_3$. However, the amount of change in aluminum thickness due to exposure to the stripping solution is so minor, less than 0.3 percent, that it may be within experimental error of the method of measurement. This indicates virtually no corrosion of the aluminum over a 120 second exposure time to the stripping solution. In the event it is determined that any significant amount of aluminum oxide is formed, one skilled in the art may use techniques known in the art to treat the surface of the substrate to remove oxide to the extent necessary to permit device function in the end use application.

Example Three

Corrosivity of Ozonated Acetic Anhydride a Copper Surface

A layer of copper was deposited to a thickness of 8,000 Å (800 nm) to 19,000 Å (1,900 nm) onto the surface of a single-crystal silicon wafer. The copper was deposited using a physical vapor deposition (PVD) process, followed by electrochemical plating. In order to test the corrosivity of ozonated acetic anhydride stripping solution on copper, ozonated acetic anhydride (100% acetic anhydride) containing at least 300 ppm (or mg/L) of ozone was sprayed onto the surface of the copper-coated substrate at room temperature (25° C.) using a dispensing system such as that shown in FIG. 2B. The ozonated acetic anhydride stripping solution was allowed to react with the copper surface for a period of 30, 60, or 120 seconds, then rinsed off the substrate surface by spraying with deionized water for a period of 10 to 20 seconds.

Table Four, below, shows the thickness of the titanium nitride layer before and after treatment with an ozonated acetic anhydride stripping solution containing 300 ppm (or mg/L) of ozone at room temperature (25° C.).

TABLE FOUR

Corrosivity of Ozonated Propionic Acid Cleaning Solution on Copper

| Sample # | Treatment Time (sec) | Pre-Treatment Cu Thickness (Å) | Post-Treatment Cu Thickness (Å) | Change in Cu Layer Thickness (Å) |
|---|---|---|---|---|
| 12 | 30 | 18,266 | 18,293 | +26 |
| 13 | 60 | 8,636 | 8,619 | −17 |
| 14 | 120 | 9,777 | 9,726 | −51 |

Within the accuracy of our ability to measure, the data in Table Four indicate that the thickness of the copper layer decreased only slightly upon exposure to ozonated acetic anhydride stripping solution.

While the invention has been described in detail above with reference to several embodiments, various modifications within the scope and spirit of the invention will be apparent to those of working skill in this technological field. Accordingly, the scope of the invention should be measured by the appended claims.

I claim:

1. A method of removing an organic-containing material from a surface of a substrate, comprising:
    providing a substrate comprising at least one of a semiconductor device substrate, a flat panel display substrate, or a solar cell array and having an organic-containing material disposed on a surface thereof; and
    removing the organic-containing material by exposing said surface of said substrate to a stripping solution comprising ozone ($O_3$) in a solvent, wherein a concentration of ozone in the solution is about 50 ppm or greater, and wherein said solvent comprises acetic anhydride.

2. A method in accordance with claim 1, wherein said concentration of ozone ranges between about 50 ppm and about 600 ppm.

3. A method in accordance with claim 1, wherein said solvent comprises acetic anhydride in combination with at least one co-solvent which is miscible with and essentially does not react with said acetic anhydride.

4. A method in accordance with claim 1, wherein said stripping solution, in addition to said acetic anhydride, includes a co-solvent selected from the group consisting of a carbonate containing from 2 to 4 carbons, ethylene glycol diacetate, and combinations thereof.

5. A method in accordance with claim 1, wherein a temperature at which said organic-containing material is removed from said substrate ranges from about 15° C. to about 80° C.

6. A method in accordance with claim 4, wherein said carbonate is selected from the group consisting of ethylene carbonate, propylene carbonate, and combinations thereof.

7. A method in accordance with claim 4, wherein said co-solvent comprises from about 20% by volume to about 80% by volume said stripping solution.

8. A method in accordance with claim 7, wherein said co-solvent contains a carbonate and ethylene glycol diacetate, and wherein a volumetric ratio of said carbonate to said ethylene glycol diacetate ranges from about 1:1 to about 3:1.

9. A method in accordance with claim 8, wherein said stripping solution comprises about 20% by volume said acetic anhydride, about 40% by volume of an ethylene carbonate, and about 40% by volume of said ethylene glycol diacetate.

10. A method of removing an organic-containing material from a surface of a substrate, comprising:
    providing a substrate comprising at least one of a semiconductor device substrate, a flat panel display substrate, or a solar cell array and having an organic-containing material disposed on a surface thereof, wherein said surface includes exposed metal; and
    removing the organic-containing material by exposing said surface including said exposed metal to a stripping solution comprising ozone ($O_3$) in a solvent, wherein a concentration of ozone ranges from about 50 ppm to about 600 ppm, and wherein said solvent comprises acetic anhydride.

11. A method in accordance with claim 10, wherein said solvent comprises acetic anhydride in combination with at least one co-solvent which is miscible with and essentially does not react with said acetic anhydride.

12. A method in accordance with claim 10, wherein said stripping solution, in addition to said acetic anhydride, includes a co-solvent selected from the group consisting of a carbonate containing from 2 to 4 carbons, ethylene glycol diacetate, and combinations thereof.

13. A method in accordance with claim 10, wherein a temperature at which said organic-containing material is removed from said substrate ranges from about 15° C. to about 80° C.

14. A method in accordance with claim 10, wherein said exposed metal includes aluminum, copper or molybdenum.

15. A method in accordance with claim 10, wherein said acetic anhydride comprises between about 10% by volume and about 95% by volume of said stripping solution.

16. A method in accordance with claim 11, wherein said co-solvent comprises from about 20% by volume to about 80% by volume of said stripping solution.

17. A method in accordance with claim 11, wherein said solvent comprises said acetic anhydride in combination with at least one carbonate.

18. A method in accordance with claim 12, wherein said carbonate is selected from the group consisting of ethylene carbonate, propylene carbonate, and combinations thereof.

19. A method in accordance with claim 13, wherein said method is performed at a temperature within a range of about 20° C. to about 70° C.

20. A method in accordance with claim 16, wherein said co-solvent contains a carbonate and ethylene glycol diacetate, and wherein a volumetric ratio of said carbonate to said ethylene glycol diacetate ranges from about 1:1 to about 3:1.

21. A method in accordance with claim 20, wherein said stripping solution comprises about 20% by volume of said acetic anhydride, about 40% by volume of an ethylene carbonate, and about 40% by volume of said ethylene glycol diacetate.

22. A method removing an organic-containing material from a substrate, comprising:
    providing a substrate comprising at least one of a semiconductor device substrate, a flat panel display substrate, or a solar cell array and having an organic-containing material disposed on a surface thereof; and removing the organic-containing material by exposing said surface to a vaporous stripping solution comprising ozone ($O_3$) in combination with a vaporous solvent, wherein a concentration of ozone in the solution is about 50 ppm or greater, and wherein said vaporous solvent comprises acetic anhydride.

23. A method in accordance with claim 22, wherein said concentration of said ozone ranges from about 50 ppm to about 800 ppm.

24. A method in accordance with claim 22, wherein said vaporous solvent comprises acetic anhydride in combination with a miscible vaporous co-solvent which essentially does not react with said vaporous acetic anhydride.

25. A method in accordance with claim 24, wherein said co-solvent is selected from the group consisting of a carbonate containing from 2 to 4 carbons, ethylene glycol diacetate, and combinations thereof.

26. A method of removing an organic-containing material from a substrate, comprising:

providing a substrate comprising at least one of a semiconductor device substrate, a flat panel display substrate, or a solar cell array and having an organic-containing material disposed on a surface thereof, wherein said surface includes exposed metal; and removing the organic-containing material by exposing said surface including said exposed metal to a vaporous stripping solution comprising ozone ($O_3$) in combination with a vaporous solvent, wherein a concentration of ozone ranges from about 50 ppm to about 600 ppm, and wherein said vaporous solvent comprises acetic anhydride.

27. A method in accordance with claim 26, wherein said vaporous solvent further comprises at least one other vaporous miscible co-solvent which essentially does not react with said acetic anhydride.

28. A method in accordance with claim 27, wherein said co-solvent is selected from the group consisting of a carbonate containing from 2 to 4 carbons, ethylene glycol diacetate, and combinations thereof.

* * * * *